(12) United States Patent
Fujimoto

(10) Patent No.: US 10,490,970 B2
(45) Date of Patent: *Nov. 26, 2019

(54) SEMICONDUCTOR LASER DEVICE

(71) Applicant: NICHIA CORPORATION, Anan-shi, Tokushima (JP)

(72) Inventor: Hideyuki Fujimoto, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,275

(22) Filed: Dec. 12, 2018

(65) Prior Publication Data

US 2019/0123511 A1   Apr. 25, 2019

Related U.S. Application Data

(63) Continuation of application No. 15/433,368, filed on Feb. 15, 2017, now Pat. No. 10,199,796.

(30) Foreign Application Priority Data

Feb. 16, 2016   (JP) .................................. 2016-027113

(51) Int. Cl.
*H01S 5/022* (2006.01)
*H01S 5/024* (2006.01)
*H01S 5/042* (2006.01)

(52) U.S. Cl.
CPC ...... *H01S 5/02256* (2013.01); *H01S 5/02276* (2013.01); *H01S 5/02469* (2013.01);
(Continued)

(58) Field of Classification Search
CPC ............. H01S 5/02256; H01S 5/02276; H01S 5/02469; H01S 5/0425; H01S 5/02212;
(Continued)

(56) References Cited

U.S. PATENT DOCUMENTS 6,765,801 B1 *   7/2004   Glenn .................... H01S 5/022
174/535
2003/0042608 A1 *   3/2003   Seol ........................ H01L 24/03
257/753

(Continued)

FOREIGN PATENT DOCUMENTS

JP   H04-167488 A   6/1992
JP   H11-218647 A   8/1999
(Continued)

OTHER PUBLICATIONS

Notice of Allowance on U.S. Appl. No. 15/433,368 dated Sep. 13, 2018.
U.S. Office Action U.S. Appl. No. 15/433,368 dated Apr. 2, 2018.

*Primary Examiner* — Xinning(Tom) Niu
(74) *Attorney, Agent, or Firm* — Foley & Lardner LLP

(57) ABSTRACT

A semiconductor laser device includes a base; a heat sink protruding upward from the base and including an upper surface and a lateral surface extending from the base to the upper surface; a plurality of lead electrodes separated from the heat sink; a submount including: a first main surface fixed to the lateral surface of the heat sink, and a second main surface including a first fixing part, an upper second fixing part, and a lower second fixing part; a protective element fixed to the upper second fixing part; and a wire connecting the protective element and one of the plurality of lead electrodes.

7 Claims, 19 Drawing Sheets

(52) U.S. Cl.
CPC .. *H01S 5/0425* (2013.01); *H01L 2224/48247* (2013.01); *H01L 2224/49111* (2013.01); *H01S 5/02212* (2013.01); *H01S 5/02292* (2013.01)

(58) Field of Classification Search
CPC ....... H01S 5/02292; H01L 2224/49111; H01L 2224/48247
See application file for complete search history.

(56) References Cited

U.S. PATENT DOCUMENTS

| | | | |
|---|---|---|---|
| 2003/0043868 A1 | 3/2003 | Stewart et al. | |
| 2004/0161002 A1* | 8/2004 | Kohara | H01S 5/02248 372/34 |
| 2013/0113015 A1 | 5/2013 | Kimura et al. | |
| 2015/0108518 A1 | 4/2015 | Samonji et al. | |
| 2016/0294157 A1 | 10/2016 | Lee et al. | |

FOREIGN PATENT DOCUMENTS

| | | | |
|---|---|---|---|
| JP | 2007-234643 A | 9/2007 |
| JP | 2009-200341 A | 9/2009 |
| JP | 2013-101996 A | 5/2013 |
| JP | 5659876 B2 | 1/2015 |
| JP | 3202736 U | 2/2016 |

* cited by examiner

SEMICONDUCTOR LASER DEVICE

CROSS-REFERENCE TO RELATED APPLICATIONS

The present application is a continuation of U.S. patent application Ser. No. 15/433,368, filed on Feb. 15, 2017, which claims priority to Japanese Patent Application No. 2016-027113, filed on Feb. 16, 2016, the disclosure of which is hereby incorporated by reference in its entirety

BACKGROUND

The present disclosure relates to a semiconductor laser device.

A semiconductor laser device includes a semiconductor laser element, a protective element and a submount on which the semiconductor laser element and the protective element are fixed, as described in, for example, Japanese Patent No. 5659876. The submount includes a fixing part on which the semiconductor laser element is fixed, and a fixing part on which the protective element is fixed. The position of each of the fixing parts on the submount is previously determined in accordance with the position where an optical waveguide region of the semiconductor laser element is formed.

Normally, semiconductor laser elements of one type are obtained from a single piece of wafer. In some cases, semiconductor laser elements differing from each other in the formation position of the optical waveguide region are obtained from a single piece of wafer, as described in, for example, Japanese Unexamined Patent Publication No. 2009-200341.

SUMMARY

With a semiconductor laser device in which the semiconductor laser element provided with an optical waveguide region around its center is disposed around the center of the submount, aligning the submount with another member of the semiconductor laser device substantially aligns the light output part of the semiconductor laser element with that other member.

However, a change in the position of the optical waveguide region on the semiconductor laser element changes the position on the submount where the semiconductor laser element is fixed, unless any change is made in the disposition position of the submount to which the semiconductor laser element is fixed. In accordance therewith, the position on the submount where the protective element is fixed also changes. The fixing part on the submount to which the semiconductor laser element or the protective element is fixed is a metal layer obtained from patterning or the like. Accordingly, in the case where the position on the submount where the semiconductor laser element or the protective element is fixed is to be changed, a submount of different type, that is, a submount having the fixing part at the position corresponding to the change is used.

However, as disclosed in JP 2009-200341 A, for example, in the case in which a plurality of semiconductor laser elements differing from each other in the formation position of the optical waveguide region is obtained from a single piece of wafer, providing a submount corresponding to the difference in the formation position necessitates using a submount of a plurality of types. Such an increase in the number of types of the submount may disadvantageously make inventory control of the submount troublesome.

The problem described above may be solved by certain embodiments of the present invention.

In one embodiment, a semiconductor laser device includes a base; a heat sink protruding upward from the base and including an upper surface and a lateral surface extending from the base to the upper surface; a plurality of lead electrodes separated from the heat sink; a submount including: a first main surface fixed to the lateral surface of the heat sink, and a second main surface having an upper half region and a lower half region, an upper edge, a lower edge, and a first lateral edge extending from the upper edge to the lower edge, the second main surface including a first fixing part, an upper second fixing part, and a lower second fixing part, wherein the upper second fixing part is disposed between the first fixing part and the first lateral edge in the upper half region, and the lower second fixing part is disposed between the first fixing part and the first lateral edge in the lower half region; a semiconductor laser element including: a light output surface, a light reflecting surface, a first lateral surface, a second lateral surface opposite the first lateral surface, a fixing surface that is fixed to the first fixing part, a wire connecting surface opposite the fixing surface, and an optical waveguide region, wherein the optical waveguide region is disposed closer to the first lateral surface than the second lateral surface, wherein the fixing surface is fixed to the first fixing part such that the light output surface is directed upward and the optical waveguide region is disposed on or around an area between a midpoint of the upper edge and a midpoint of the lower edge of the second main surface as seen in a front view; a protective element fixed to the upper second fixing part; and a wire connecting the protective element and one of the plurality of lead electrodes.

In another embodiment, a semiconductor laser device includes a housing including: an insulating part, a plurality of wiring parts, and a recess defined by a bottom surface and inner lateral surfaces surrounding the bottom surface, wherein the wiring parts are partially exposed from the insulating part at the recess; a submount including: a first main surface fixed to the bottom surface of the recess, a second main surface having a front half region and a rear half region, a front edge, a rear edge, and a first lateral edge extending from the front edge to the rear edge, the second main surface including a first fixing part, a front second fixing part, and a rear second fixing part, wherein the front second fixing part is disposed between the first fixing part and the first lateral edge in the front half region, and the rear second fixing part is disposed between the first fixing part and the first lateral edge in the rear half region; a semiconductor laser element including: a light output surface, a light reflecting surface, a first lateral surface, a second lateral surface opposite the first lateral surface, a fixing surface that is fixed to the first fixing part, and a wire connecting surface opposite the fixing surface, and an optical waveguide region, wherein the optical waveguide region is disposed closer to the first lateral surface than the second lateral surface, wherein the fixing surface is fixed to the first fixing part such that the light output surface is directed frontward and the optical waveguide region is disposed on or around an area between a midpoint of the front edge and a midpoint of the rear edge of the second main surface as seen in a top view; a protective element fixed to the front second fixing part; and a wire connecting the protective element and one of the plurality of wiring parts.

With the above-described semiconductor laser device, the submount of a single type in which the fixing part is formed at a unique position can be used for both the semiconductor laser elements differing from each other in the position of the optical waveguide region. This prevents an increase in the number of types of the submount, making the inventory control less troublesome.

DETAILED DESCRIPTION

Semiconductor Laser Device 1 According to First Embodiment

Figure 1A:
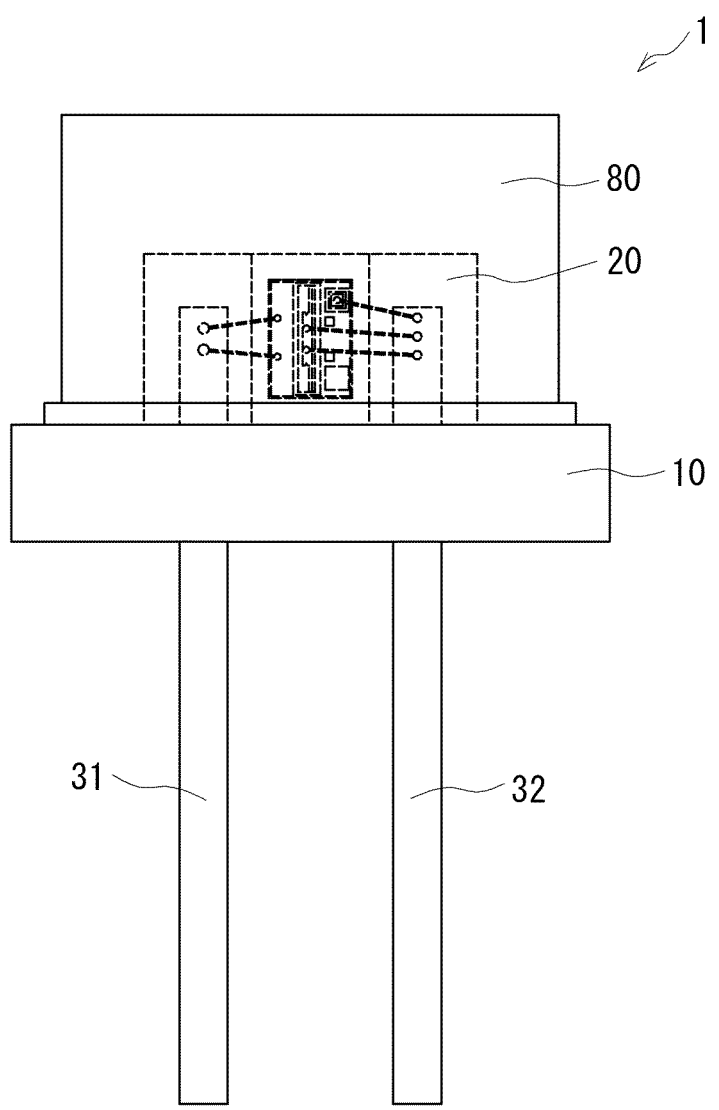
FIG. 1A is a schematic front view of a semiconductor laser device according to a first embodiment.
Figure 1B:
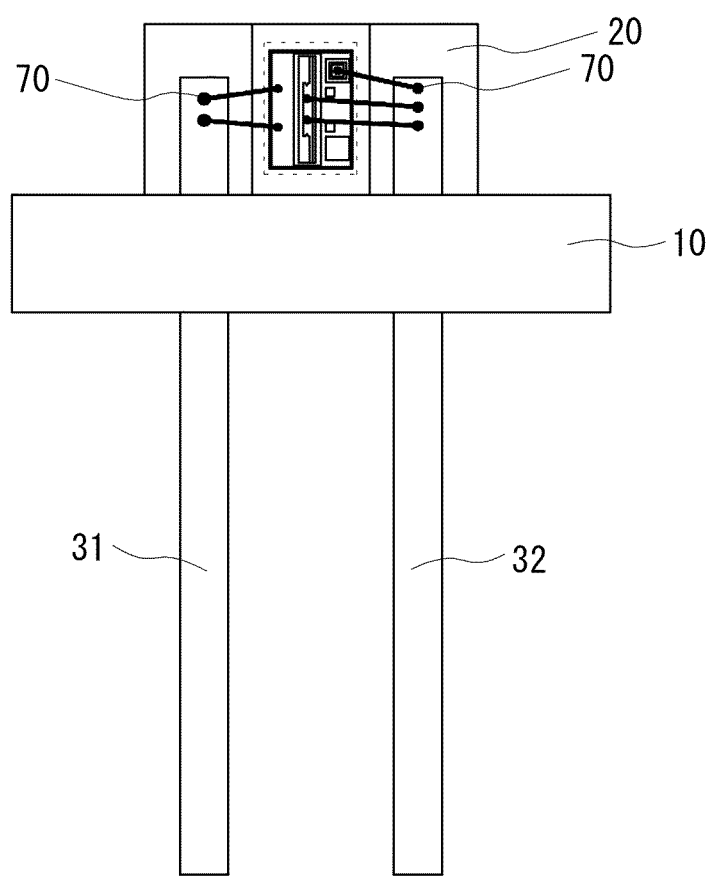
FIG. 1B is a schematic front view of the semiconductor laser device according to the first embodiment (in which a cap is not shown).
Figure 1C:
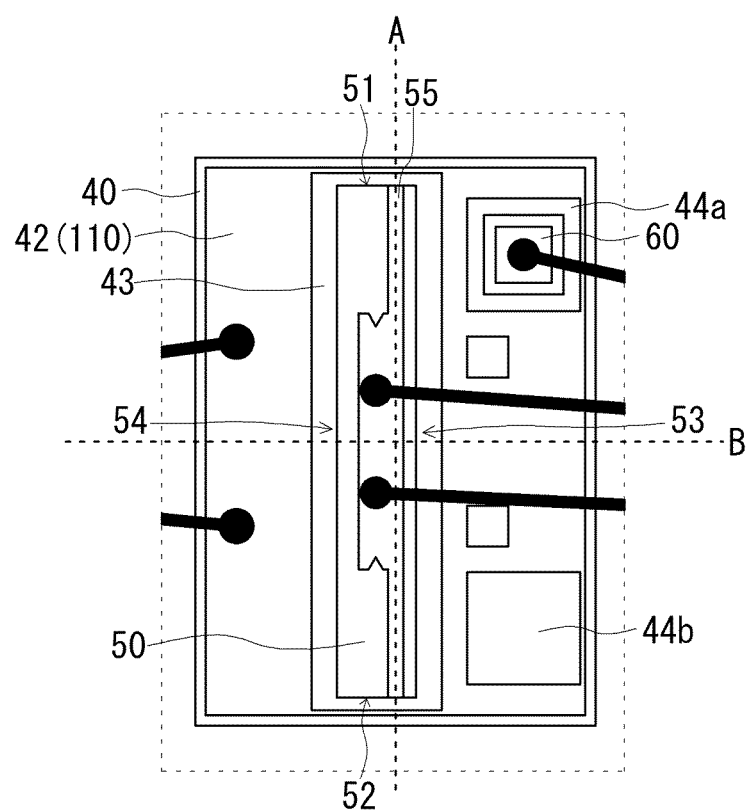
FIG. 1C is an enlarged view of a portion surrounded by a broken line in FIG. 1B.
Figure 1D:
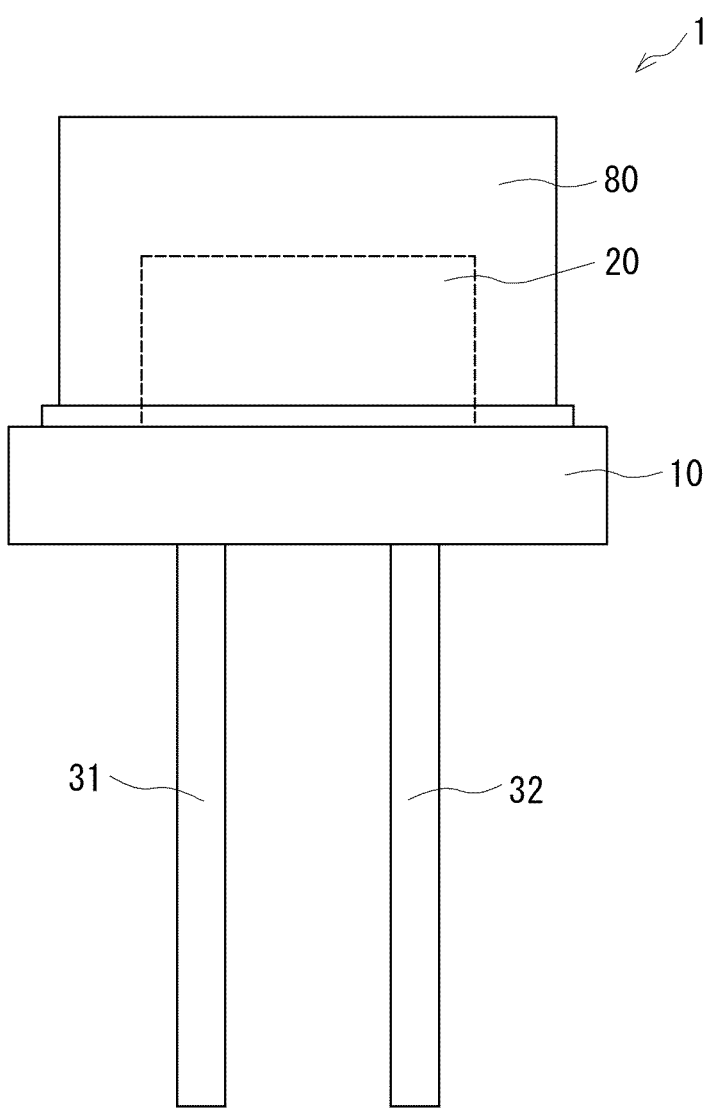
FIG. 1D is a schematic rear view of the semiconductor laser device according to the first embodiment.
Figure 1E:
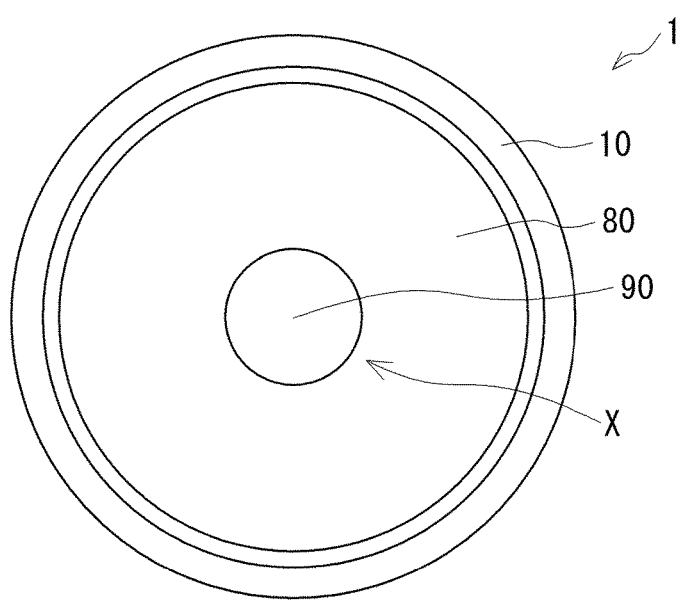
FIG. 1E is a schematic plan view of the semiconductor laser device according to the first embodiment.
Figure 1F:
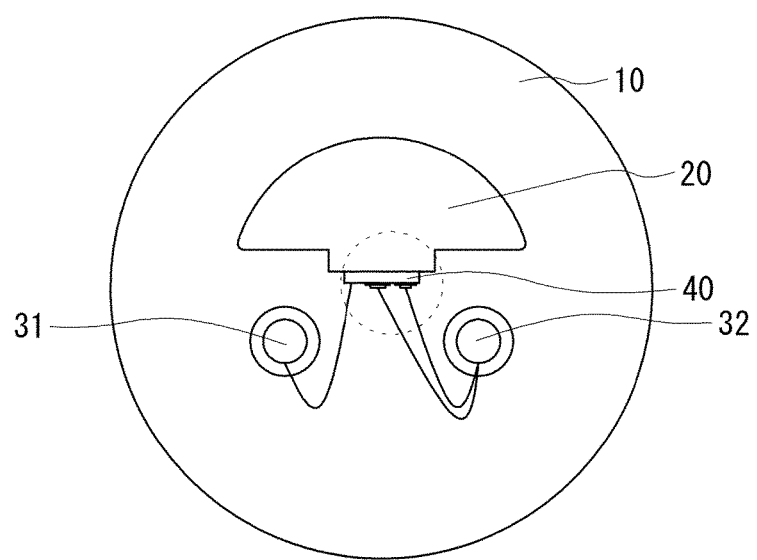
FIG. 1F is a schematic plan view of the semiconductor laser device according to the first embodiment (in which the cap is not shown).
Figure 1G:
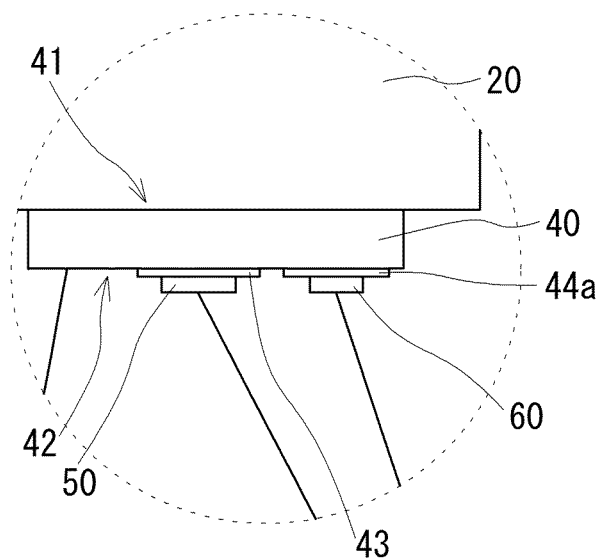
FIG. 1G is an enlarged view of a portion surrounded by a broken line in FIG. 1F.
Figure 1H:
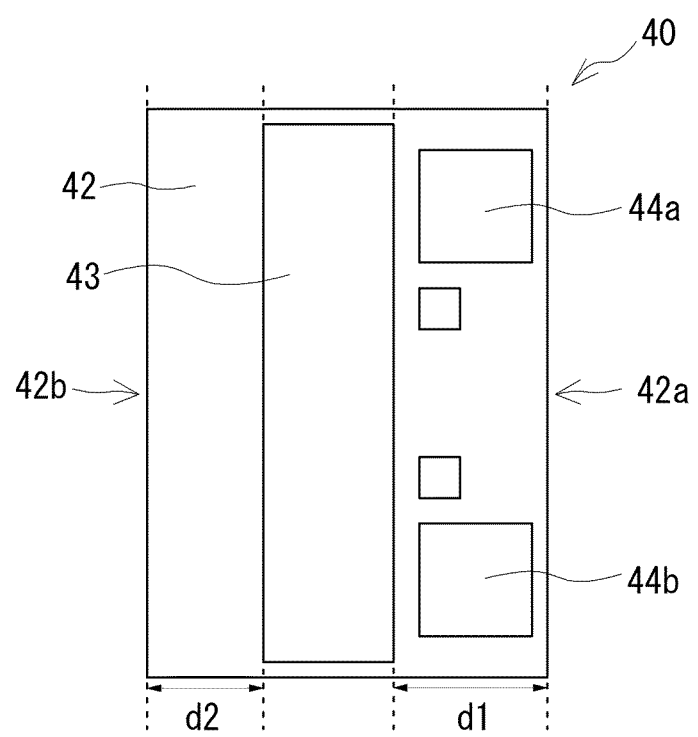
FIG. 1H is a schematic front view of a submount according to the first embodiment.

FIGS. 1A, 1B, and 1C are a schematic front view of a semiconductor laser device 1 according to the first embodiment, a schematic front view (in which a cap is not shown) thereof, and an enlarged view of a portion surrounded by a broken line in FIG. 1B, respectively. FIGS. 1D, 1E, 1F, and 1G are a schematic rear view of the semiconductor laser device 1, a schematic plan view thereof, a schematic plan view (in which the cap is not shown) thereof, and an enlarged view of a portion surrounded by a broken line in FIG. 1F, respectively. FIG. 1H is a schematic front view of a submount 40 according to the first embodiment. For ease of understanding, FIG. 1A illustrates each member covered with a cap 80 with a broken line, showing each member through the cap 80.

As shown in FIGS. 1A to 1H, the semiconductor laser device 1 includes: a base 10; a heat sink 20 disposed above the base 10; a plurality of lead electrodes 31, 32 disposed laterally relative to the heat sink 20; a submount 40 including a first main surface 41 and a second main surface 42, the first main surface 41 being fixed to a lateral surface of the heat sink 20, the second main surface 42 including a first fixing part 43 and two second fixing parts 44a, 44b disposed laterally relative to the first fixing part 43 and respectively in an upper half region and a lower half region of the second main surface 42; a semiconductor laser element 50 including a light output surface 51, a light reflecting surface 52, two lateral surfaces 53, 54 intersecting the light output surface 51, and an optical waveguide region 55 formed to be offset toward one of the two lateral surfaces 53, 54, the semiconductor laser element 50 being fixed to the first fixing part 43 so that the light output surface 51 is directed upward and the optical waveguide region 55 is disposed on or around a line A that passes through the midpoint of the upper edge and the midpoint of the lower edge of the second main surface 42 as seen in a front view; a protective element 60 fixed to upper one of the two second fixing parts 44a, 44b; and a wire 70 connecting between the protective element 60 and one of the plurality of lead electrodes 31, 32. In the following, a detailed description is given.

(Base 10)

Preferably, the base 10 is made of a material exhibiting relatively high thermal conductivity, e.g., about 20 W/mK or greater, so that heat generated at the semiconductor laser element 50 is efficiently released to the outside. Specifically, use of metal such as Cu, Al, Fe, Ni, Mo, CuW, CuMo or the like is preferable.

Exemplary shapes of the base 10 as seen in a plan view include a circle, an ellipse, a polygon such as a quadrangle, and any shape similar to the foregoing. More specifically, for example a circular and flat member having a diameter of about 3 mm to 10 mm may be employed as the base 10. Preferably, the thickness of the base 10 is, for example, about 0.5 mm to 5 mm.

(Heat Sink 20)

The heat sink 20 may be made of the material identical to that of the base 10, or may be made of a different material. For example, as the material of the base 10, iron alloy may be employed for welding the cap 80, and copper or copper alloy being excellent in heat releasing property may be employed as the material of the heat sink 20. Thus, the heat sink 20 can efficiently release heat from the semiconductor laser element 50. The heat sink 20 is at least partially disposed above the base 10. The base 10 and the heat sink 20 may be made of separate members, or they may be parts of a single member. In the present embodiment, a member structured by the base 10 and the heat sink 20 serves as the stem.

(Plurality of Lead Electrodes 31, 32)

The lead electrodes 31, 32 are members for connecting the semiconductor laser element 50 to the external power supply. An electrically conductive material is employed for the lead electrodes 31, 32. The lead electrodes 31, 32 are, for example, rod-like members made of metal. The lead electrodes 31, 32 are, for example, disposed so as to penetrate through holes provided at the base 10, and bonded to the base 10 with low melting point glass or the like. The lead electrodes 31, 32 are disposed laterally relative to the heat sink 20. In the present embodiment, as shown in FIG. 1F, the lead electrodes 31, 32 are disposed at positions on the front side of the heat sink 20 and being spaced apart from the heat sink 20. Such a disposition is also referred to as "disposed laterally relative to the heat sink 20".

(Submount 40)

The submount 40 is preferably made of a material that shows a smaller difference in thermal expansion coefficient from the semiconductor laser element 50 than the base 10 and the heat sink 20 do, so as to prevent the semiconductor laser element 50 from coming off. Further, the submount 40 is preferably made of a material that exhibits high thermal conductivity so as to be capable of efficiently releasing heat generated at the semiconductor laser element 50. Specifically, AlN, CuW, diamond, SiC, ceramic or the like may be preferably employed as the submount 40.

The submount 40 includes the first main surface 41 and the second main surface 42. The first main surface 41 can be fixed to the lateral surface of the heat sink 20 with Au bumps, Au nanoparticles, Ag nanoparticles, AuSn solder, a solder paste member and the like. While the submount 40 and the heat sink 20 may be in direct contact with each other, other member may be interposed between the submount 40 and the heat sink 20.

The second main surface 42 includes the first fixing part 43 and the second fixing parts 44a, 44b. The semiconductor laser element 50 is fixed to the first fixing part 43, and the protective element 60 is fixed to one of the two second fixing parts 44a, 44b.

The first fixing part 43 and the second fixing parts 44a, 44b are preferably made of a metal material, for example, and particularly preferably have an adhesive layer which is molten by being heated and with which the semiconductor laser element 50 and the like are bonded. Thus, the semiconductor laser element 50 and the like can be surely fixed to the first fixing part 43 and the second fixing parts 44a, 44b. For example, when the first fixing part 43 and the second fixing parts 44a, 44b are Pt/AuSn/Au, AuSn serves as the adhesive layer, and Pt and Au serve as cover layers that cover the adhesive layer. Note that, in the present embodiment, the first fixing part 43 and the second fixing parts 44a, 44b are entirely structured by the adhesive layer (e.g., AuSn).

The first fixing part 43 is disposed to be positioned on the line A that passes through the midpoint of the upper edge and the midpoint of the lower edge of the second main surface 42 as seen in a front view. Further, the first fixing part 43 is disposed such that the optical waveguide region 55 of the semiconductor laser element 50 is positioned on or around the line A. Thus, aligning the submount 40 with the heat sink 20 such that the line A of the submount 40 matches with the line that passes through the midpoint of the upper edge and the midpoint of the lower edge of the heat sink 20 aligns the light output part of the semiconductor laser element 50 (the end of the optical waveguide region 55 on the light output surface 51 side) with the heat sink 20. This facilitates alignment of the semiconductor laser element 50 with the heat sink 20.

With such a disposition, turning the submount 40 upside down (that is, fixing the semiconductor laser element 50 to the submount 40 that is rotated by 180 degrees about the center of the second main surface 42) depending on whether the semiconductor laser element 50 has its optical waveguide region 55 positioned offset toward the lateral surface 53 (the right lateral surface when the light output surface 51 is the upper surface, and hereinafter referred to as "the first lateral surface 53") or toward the other lateral surface 54 (the left lateral surface when the light output surface 51 is the upper surface, and hereinafter referred to as "the second lateral surface 54") allows the optical waveguide region 55 to be disposed on or around the line A connecting between the midpoint of the upper edge and the midpoint of the lower edge of the second main surface 42. Accordingly, the submount 40 can be used for both the semiconductor laser elements 50 of two types differing from each other in the position of the optical waveguide region 55.

As used herein, the semiconductor laser elements of two types can be defined as follows. For example, when the semiconductor laser elements of two types are placed adjacent to each other on the right and left sides having their respective light output surfaces directed upward, while they are different in whether the position of the optical waveguide region is offset toward the right side or toward the left side, rotating one of the semiconductor laser element about its center by 180 degrees sets the position of the optical waveguide region in the whole semiconductor laser element identical to that in the other semiconductor laser element. In other words, the semiconductor laser elements of two types are line symmetric to each other. Thus, in the case where the submount 40 is turned upside down also, the position of the optical waveguide region of the semiconductor laser element is substantially the same.

The distance between the light output part of the semiconductor laser element 50 and the line A as seen in a front view is preferably 50 μm or smaller, and the angle formed between the optical waveguide region 55 and the line A is preferably 2° or smaller. Thus, the light output part of the semiconductor laser element 50 can be precisely aligned with the heat sink 20. Note that, the light output part of the semiconductor laser element 50 is representatively disposed so as to be positioned at the center of the semiconductor laser device 1 as seen in a plan view. Accordingly, preferably the heat sink 20 is disposed to achieve the following: disposing the light output part of the semiconductor laser element 50 so as to substantially match with the line that passes through the midpoint of the upper edge and the midpoint of the lower edge of the heat sink 20 as seen in a front view automatically positions the light output part of the semiconductor laser element 50 at the center of the semiconductor laser device 1 as seen in a plan view.

The first fixing part 43 is preferably elongated in one direction (the top-bottom direction) for fixing the semiconductor laser element 50. This is because the optical waveguide region 55 has the shape elongated in one direction, that is, the semiconductor laser element 50 including the optical waveguide region 55 has the shape elongated in one direction.

The two second fixing parts 44a, 44b are disposed laterally relative to the first fixing part 43 and respectively in the upper half region and the lower half region of the second main surface 42. The side from which the semiconductor laser element 50 emits laser light (the light output surface 51 side) is the upper side, and the side opposite thereto (the light reflecting surface 52 side) is the lower side. The region occupying the upper half of the second main surface 42 is the upper half region, and the region occupying the lower half thereof is the lower half region. The center of the second main surface 42 is a point of intersection of the line A that passes through the midpoint of the upper edge and the midpoint of the lower edge of the second main surface 42 and a line B that passes through the midpoint of the right edge and the midpoint of the left edge of the second main surface 42. Here, the region being higher than the line B is the upper half region, and the region being lower than the line B is the lower half region. Here, the term "as seen in a front view" refers to viewing the second main surface 42 of the submount 40 in the direction substantially perpendicular to the second main surface 42.

In such a disposition, irrespective of whether the submount 40 is normally oriented or turned upside down, the protective element 60 can be fixed to upper one of the two second fixing parts 44a, 44b. Accordingly, the present embodiment can provide the semiconductor laser device 1 being reduced in size (reduced in length in the top-bottom direction of the semiconductor laser device 1), and the semiconductor laser device suitable for mounting the high-power semiconductor laser element 50 with a greater cavity length (the length in the extending direction of the optical waveguide region 55). The reason thereof is explained in the following.

Figure 3A:
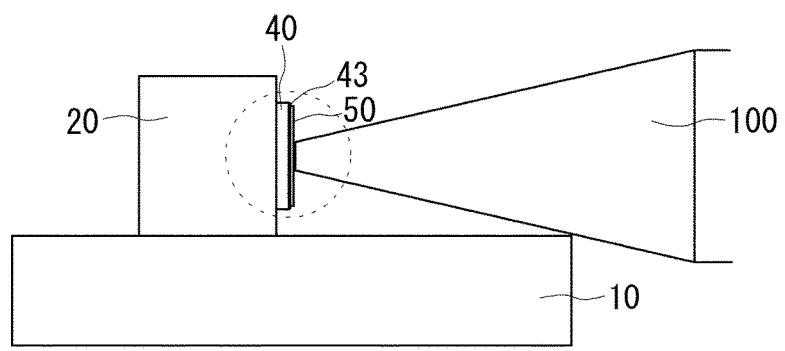
FIG. 3A is a schematic side view showing the positional relationship between the semiconductor laser element and a collet.
Figure 3B:
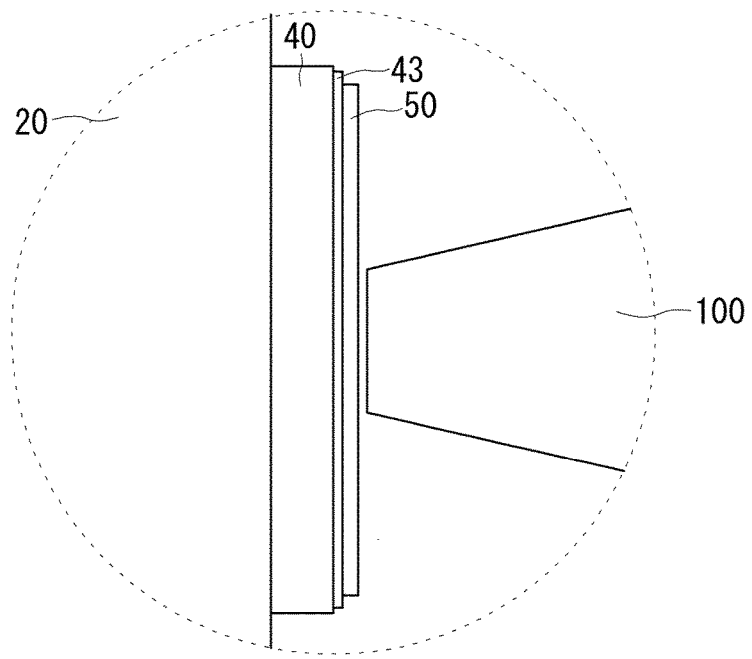
FIG. 3B is an enlarged view of a portion surrounded by a broken line in FIG. 3A.

As shown in FIGS. 3A to 4B, a collet 100 is used in performing die bonding or wire bonding of the semiconductor laser element 50 and the protective element 60. The die bonding refers to disposing and fixing the semiconductor laser element 50 and the protective element 60 to respective fixing parts, and the wire bonding refers to connecting the wires 70 to the semiconductor laser element 50 and the protective element 60. In the die bonding, the semiconductor laser element 50 or the protective element 60 is attached to the tip of the collet 100 under suction, and carried to the bonding position. Further, in the wire bonding, the tip of the wire-bonding collet 100 that discharges the wire is pressed against the semiconductor laser element 50 or the protective element 60. Therefore, the position of the semiconductor laser element 50 and the protective element 60 must be in the range where contact between the collet 100 and the base 10 during such die bonding or wire bonding is prevented. In FIGS. 3A and 4A, the collet 100 contacts with the base 10, so the collet 100 is allowed to move upward from a position shown in FIGS. 3A and 4A.

Meanwhile, assuming that the second fixing part is provided just one in number, when the submount 40 is turned upside down to be used for both the semiconductor laser elements 50 differing from each other in the position of the optical waveguide region 55, the distance between the second fixing part and the base 10 changes greatly. In this case, the second fixing part must be spaced apart from the base 10 so as to avoid contact between the collet 100 and the base 10 irrespective of whether the submount 40 is normally oriented or turned upside down. When the second fixing part is disposed at the center of the submount 40, the distance from the base 10 little changes by the submount 40 being turned upside down. However, in this case also, the second fixing part must be fully distanced from the base 10. In any of the cases, the second fixing part being provided just one in number requires space above and below the second fixing part substantially equally, increasing the length of the submount 40 in the top-bottom direction.

In contrast thereto, in the disposition of the present embodiment, the protective element 60 is fixed to upper one of the second fixing parts 44a, 44b. Thus, irrespective of whether the submount 40 is normally oriented or turned upside down, a great distance is reliably obtained from the protective element 60 to the base 10, whereby contact between the base 10 and the collet 100 is avoided. This eliminates the necessity of providing excessive space between the upper one of the second fixing parts 44a, 44b and the upper edge of the submount 40, and thus prevents an increase in length in the top-bottom direction of the submount 40. Accordingly, a reduction in size of the semiconductor laser device 1 (a reduction in length in the top-bottom direction of the semiconductor laser device 1) is achieved.

Further, while the semiconductor laser element 50 of higher power can be obtained by increasing the cavity length (the length in the extending direction of the optical waveguide region 55), an increase in the cavity length increases the length in the top-bottom direction of the submount 40. However, in the disposition of the present embodiment, as has been described above, an increase in length in the top-bottom direction of the submount 40 is prevented as compared to the case where the second fixing part is provided just one in number. Accordingly, also in the case where the semiconductor laser element 50 being greater in the cavity length is mounted, an increase in size of the semiconductor laser device 1 (an increase in length in the top-bottom direction of the semiconductor laser device 1) can be prevented. Hence, the present embodiment is suitable for mounting such a semiconductor laser element 50.

In the case where the second main surface 42 is quadrangular being elongated in the top-bottom direction, preferably, the distance d1 between a first 42a of two long edges of the second main surface 42 and the first fixing part 43 is greater than the distance d2 between a second 42b of the two long edges and the first fixing part 43, and the second fixing parts 44a, 44b are disposed between the first fixing part 43 and the first long edge 42a. Thus, the region provided with neither the first fixing part 43 nor the second fixing parts 44a, 44b can be reduced in size. Therefore, the second main surface 42 can be reduced in area, whereby the submount 40 can be reduced in size. The distance d2 between the other long edge and the first fixing part 43 is, for example, 10% to 80% as great as the distance d1 between the first long edge 42a and the first fixing part 43. Further, the distance d2 is preferably great enough to prevent the first fixing part 43 from erroneously being cut in singulation of the submount 40, that is, for example, the distance d2 is preferably 30 μm or greater.

The area of the first fixing part 43 is preferably at least as great as the area of the semiconductor laser element 50 as seen in a front view. Similarly, the area of each of the second fixing parts 44a, 44b is preferably at least as great as the area of the protective element 60 as seen in a front view. Normally, the protective element 60 is smaller in size than the semiconductor laser element 50, and therefore the area of each of the second fixing parts 44a, 44b is preferably smaller than the first fixing part 43. Thus, the second main surface 42 is reduced in area within a range allowing the area of each of the fixing parts to be great enough for the elements to be surely fixed, whereby the submount 40 is reduced in size. Representatively, the total area of the two second fixing parts 44a, 44b is smaller than the area of the first fixing part 43. The length of the first fixing part 43 (the length in the top-bottom direction) is specifically greater than the length of the semiconductor laser element 50. Further, an increase in length of the submount 40 necessitates an increase in length of the heat sink 20, resulting in an increase in length of the semiconductor laser device 1. Accordingly, the length of the first fixing part 43 is preferably equal to or smaller than the value obtained by adding about 100 μm to the length of the semiconductor laser element 50. This suppresses an increase in length of the semiconductor laser device 1.

(Semiconductor Laser Element 50)

The semiconductor laser element 50 may be a compound semiconductor such as a Group III-V compound semiconductor. For example, the semiconductor laser element 50 includes an active layer being a nitride semiconductor such as InGaN, GaN or the like. The semiconductor laser element 50 includes, for example, on an electrically conductive or insulating substrate, a semiconductor layered body which includes an n-type semiconductor layer, an active layer, and a p-type semiconductor layer, and further includes an n-electrode electrically connected to the n-type semiconductor layer, and a p-electrode electrically connected to the p-type semiconductor layer. As described above, the submount 40 according to the present embodiment is suitable for mounting the semiconductor laser element 50 with a great cavity length. The great cavity length specifically means that the cavity length is at least half as great as the length of the heat sink 20 (the length in the top-bottom direction). Such a semiconductor laser element 50 with a great cavity length is representatively high-power.

The semiconductor laser element 50 includes the light output surface 51 and the light reflecting surface 52, and is fixed to the first fixing part 43 so that the light output surface 51 is directed upward. Specifically, the semiconductor laser element 50 may be fixed with a fixing layer made of Au nanoparticles, Ag nanoparticles, AuSn solder, a solder paste member or the like. The semiconductor laser element 50 may have its semiconductor layer fixed to the first fixing part 43 (junction-down mounting), or may have its substrate fixed to the first fixing part 43 (junction-up mounting). The optical waveguide region 55 is a region elongated in one direction and connects between the light output surface 51 and the light reflecting surface 52. The semiconductor layered body may be provided with a ridge for current confinement and light confinement. In this case, the portion where the ridge exists as seen in a front view is regarded as the optical waveguide region 55.

The semiconductor laser element 50 includes two lateral surfaces 53, 54 that intersect with the light output surface 51. The lateral surfaces 53, 54 are not in parallel to the first main surface 41 and the second main surface 42, and are representatively substantially perpendicular to the first main surface 41 and the second main surface 42. The optical waveguide region 55 of the semiconductor laser element 50 is formed to be offset toward one (in the present embodiment, the first lateral surface 53) of the two lateral surfaces 53, 54. That is, the optical waveguide region 55 is disposed so as to exclude the line that passes through the midpoint of the upper edge (the edge formed by the light output surface 51) and the midpoint of the lower edge (the edge formed by the light reflecting surface 52) as seen in a front view. Here, the term "as seen in a front view" refers to viewing in the direction substantially perpendicular to the wire connected surface of the semiconductor laser element 50. The wire connected surface is the surface opposite to the surface fixed to the first fixing part 43.

The shape of the semiconductor laser element 50 as seen in a front view is substantially quadrangular, for example.

As shown in FIGS. 1B and 1C, in the case where the optical waveguide region 55 of the semiconductor laser element 50 is formed to be offset toward the first lateral surface 53, the two second fixing parts 44a, 44b are preferably disposed on the first lateral surface 53 side. This enables a reduction in size of the region provided with neither the first fixing part 43 nor the second fixing parts 44a, 44b when the first fixing part 43 is disposed such that the optical waveguide region 55 is disposed on or around the line A connecting between the midpoint of the upper edge and the midpoint of the lower edge of the second main surface 42. Thus, the second main surface 42 can be reduced in area, whereby the submount 40 can be reduced in size. The same holds true for the case where the optical waveguide region 55 of the semiconductor laser element 50 is formed to be offset toward the second lateral surface 54.

That is, in this case, the two second fixing parts 44a, 44b are preferably formed on the second lateral surface 54 side.

The distance between the tip of the collet 100 brought into contact with the semiconductor laser element 50 and the base 10, in other words, the distance between the region on the semiconductor laser element 50 that is brought into contact with the tip of the collet 100 and the base 10 is the distance that avoids contact between the collet 100 and the base 10, for example, about 760 μm to 1.0 mm. Accordingly, for example in the case where the tip of the collet 100 is brought into contact with the center of an electrode of the semiconductor laser element 50, the distance between the center of the electrode and the base 10 falls within such a range. Note that, the collet 100 normally has a tapered shape which becomes smaller toward the tip. Accordingly, the collet 100 being brought into contact with the base 10 refers to a portion of the collet 100, which portion is distanced from the tip and relatively thick, abutting on the base 10. Further, normally, the semiconductor laser element 50 is greater in size than the tip of the collet 100. Therefore, the distance between the semiconductor laser element 50 and the base 10 becomes smaller than the distance between the contact position at the tip of the collet 100 and the base 10, unless the contact position of the collet 100 is the lower end of the semiconductor laser element 50. The smallest distance between the semiconductor laser element 50 and the base 10 is, for example, from 100 μm to 300 μm.

(Protective Element 60)

The protective element 60 is a member for protecting the semiconductor laser element 50 from electrical breakdown caused by surge current. The protective element 60 is connected in antiparallel to the semiconductor laser element 50. In the case where a voltage is applied to the semiconductor laser element 50 in the reverse direction, or an excessive voltage is applied thereto in the forward direction, current is caused to pass through protective element 60 instead of the semiconductor laser element 50. Thus, the protective element 60 prevents the semiconductor laser device 1 from being damaged. The protective element 60 may be, for example, a Zener diode. The Zener diode may be made of Si, GaAs and the like.

The protective element 60 is fixed to the upper one of the two second fixing parts 44a, 44b. Specifically, the protective element 60 may be fixed with a fixing layer made of Au nanoparticles, Ag nanoparticles, AuSn solder, a solder paste member or the like.

Figure 4A:
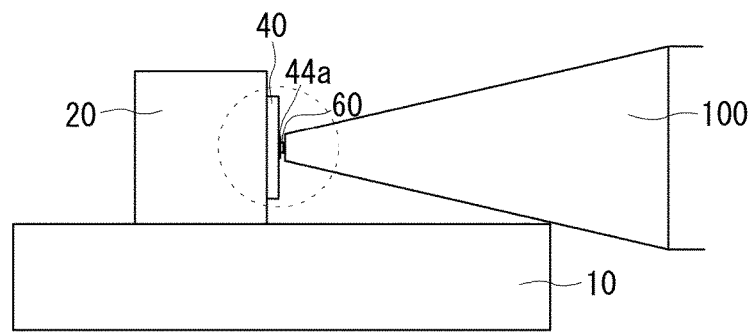
FIG. 4A is a schematic side view showing the positional relationship between a protective element and the collet.
Figure 4B:
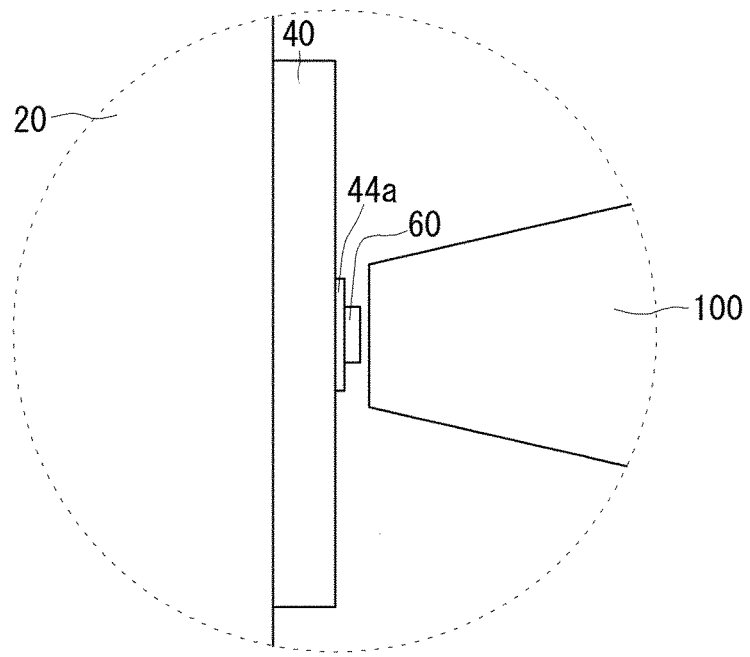
FIG. 4B is an enlarged view of a portion surrounded by a broken line in FIG. 4A.

As shown in FIGS. 4A and 4B, normally, the protective element 60 is smaller in size than the semiconductor laser element 50, and for example, substantially as great as the tip of the collet 100. Accordingly, when the distance between the tip of the collet 100 being brought into contact with the protective element 60 and the base 10 is the distance with which the collet 100 is not brought into contact with the base 10, for example, about 760 μm or greater, the distance between the protective element 60 and the base 10 also assumes the similar value. Further, in order to set the two second fixing parts 44a, 44b to be spaced apart, the distance between the protective element 60 and the base 10 may be greater than the foregoing value, and may be, for example, about 1.0 mm to 1.2 mm. As described above, since the protective element 60 is substantially as great as the tip of the collet 100, the distance between the lower end of the protective element 60 and the base 10 is, for example, about 1.0 mm at a minimum. Accordingly, the protective element 60 is disposed such that its lower end is spaced apart from the base 10 farther than the lower end of the semiconductor laser element 50.

Representatively, as shown in FIGS. 1B and 1C, the protective element 60 is disposed to be higher than the wires 70 connected to the semiconductor laser element 50.

In one semiconductor laser device 1, just a single protective element 60 will suffice. That is, the protective element 60 should be fixed to just one of the two second fixing parts 44a, 44b (to just the upper second fixing part 44a), and other one of the second fixing parts 44a, 44b (the lower second fixing part 44b) should be left unused.

(Wires 70)

The wire 70 connects between the semiconductor laser element 50 and at least one of a plurality of lead electrodes 31, 32. Further, the wire 70 connects between the protective element 60 and at least one of the plurality of lead electrodes 31, 32. In FIGS. 1B and 1C, the wire 70 connects between the anode of the semiconductor laser element 50 and the second lead electrode 32. Further, the wire 70 connects between the cathode of the protective element 60 and the second lead electrode 32. The cathode of the semiconductor laser element 50 and the anode of the protective element 60 are both electrically connected to an electrically conductive layer 110 provided at the second main surface 42 of the submount 40 with an electrically conductive adhesive agent. The electrically conductive layer 110 is connected to the first lead electrode 31 with the wire 70. Accordingly, the cathode of the semiconductor laser element 50 and the anode of the protective element 60 are both electrically connected to the first lead electrode 31. A connecting portion connecting between the electrically conductive layer 110 and the wire 70 is positioned between the first fixing part 43 and the other long edge of the submount 40 (the long edge on the side where the second fixing parts 44a, 44b are not disposed). Note that, when the protective element 60 and the like have their anode and cathode on the identical surface, the electrodes should be directly connected to the first lead electrode 31 and the second lead electrode 32 with the wires 70, respectively.

The wire 70 is a linear member made of metal such as Au, Ag or the like, and may have a diameter of about 10 μm to 50 μm.

The semiconductor laser element 50 and at least one of the plurality of lead electrodes 31, 32 may be connected to each other with a single wire 70, or may be connected to each other with a plurality of wires 70. Similarly, the protective element 60 and at least one of the plurality of lead electrodes 31, 32 may be connected to each other with a single wire 70, or may be connected to each other with a plurality of wires 70.

(Others)

The semiconductor laser device 1 may further include a cap 80 that is disposed to cover the semiconductor laser element 50 and the protective element 60. The cap 80 may be made of, for example, Ni, Co, Fe, Ni—Fe alloy, Kovar, brass or the like. The cap 80 may be bonded to the base 10 by resistance welding or the like. Preferably, the bonding the cap 80 to the base 10 airtightly seals the semiconductor laser element 50. Thus, the semiconductor laser element 50 is prevented from attracting dust due to laser oscillation.

The cap 80 has an opening X at its upper surface, for allowing laser light to transmit. In the present embodiment, as shown in FIG. 1E, the opening X is provided at the top of the cap 80 bonded to the base 10. To the opening X, a light-transmissive member 90 for extracting laser light can be provided. The light-transmissive member 90 may be made of, for example, glass, sapphire, ceramic or the like. A functional membrane that selectively reflects light of a particular wavelength or a particular angle may be provided at the surface of the light-transmissive member 90. The light-transmissive member 90 may contain a wavelength conversion member, a light diffusing member and the like.

(Manufacturing Method)

In the following, a description will be given of a method of manufacturing the semiconductor laser device 1.

Firstly, the base 10, the heat sink 20, and a plurality of lead electrodes 31, 32 are provided. Next, simultaneously with, before, or after disposition of the submount 40 at the heat sink 20, the semiconductor laser element 50 is disposed at the first fixing part 43. Simultaneously with, before, or after disposition of the semiconductor laser element 50, the protective element 60 is disposed at the upper one of the two second fixing parts 44a, 44b. Then, the protective element 60 and one of the plurality of lead electrodes 31, 32 are connected to each other with the wire 70.

The semiconductor laser element 50 used herein is selected from a group consisting of a semiconductor laser element in which the optical waveguide region 55 is offset toward one lateral surface (the first lateral surface 53), and a semiconductor laser element in which the optical waveguide region 55 is offset toward other lateral surface (the second lateral surface 54). The orientation of the submount 40 is determined based on the position of the optical waveguide region 55 of the selected semiconductor laser element 50. That is, the submount 40 is disposed at the heat sink 20 as being oriented so that the optical waveguide region 55 of the semiconductor laser element 50 is disposed on or around the line A connecting between the midpoint of the upper edge and the midpoint of the lower edge of the second main surface 42.

Note that, the first fixing part 43 is provided at the submount 40 in the shape and position with which, irrespective of whether the optical waveguide region 55 is offset toward one lateral surface (the first lateral surface 53) or toward the other lateral surface (the second lateral surface 54), properly setting the upper edge and the lower edge of the submount 40 disposes the optical waveguide region 55 on or around the line A.

Through the foregoing operations, the semiconductor laser device 1 can be manufactured.

As has been described above, according to the present embodiment, turning the submount 40 upside down depending on whether the semiconductor laser element 50 has its optical waveguide region 55 positioned offset toward the first lateral surface 53 or toward the second lateral surface 54 allows the optical waveguide region 55 to be disposed on or around the line A connecting between the midpoint of the upper edge and the midpoint of the lower edge of the second main surface 42. Accordingly, the submount 40 of a single type in which the fixing part is formed at a unique position can be used for both the semiconductor laser elements 50 differing from each other in the position of the optical waveguide region 55. This prevents an increase in the number of types of the submount 40, making the inventory control less troublesome.

Further, according to the present embodiment, irrespective of whether the submount 40 is normally oriented or turned upside down, the protective element 60 can be fixed to the upper one of the second fixing parts 44a, 44b. Accordingly, in the case where the submount 40 of a single type is used for both the semiconductor laser elements 50 differing from each other in the position of the optical waveguide region 55, an increase in length in the top-bottom direction of the submount 40 can be prevented. This achieves a reduction in size of the semiconductor laser device 1 (a reduction in length in the top-bottom direction of the semiconductor laser device 1), and it becomes possible to provide the semiconductor laser device 1 reduced in size while being equipped with the high-power semiconductor laser element 50 of a great cavity length (the length in the extending direction of the optical waveguide region 55).

Semiconductor Laser Device 2 According to Second Embodiment

Figure 2A:
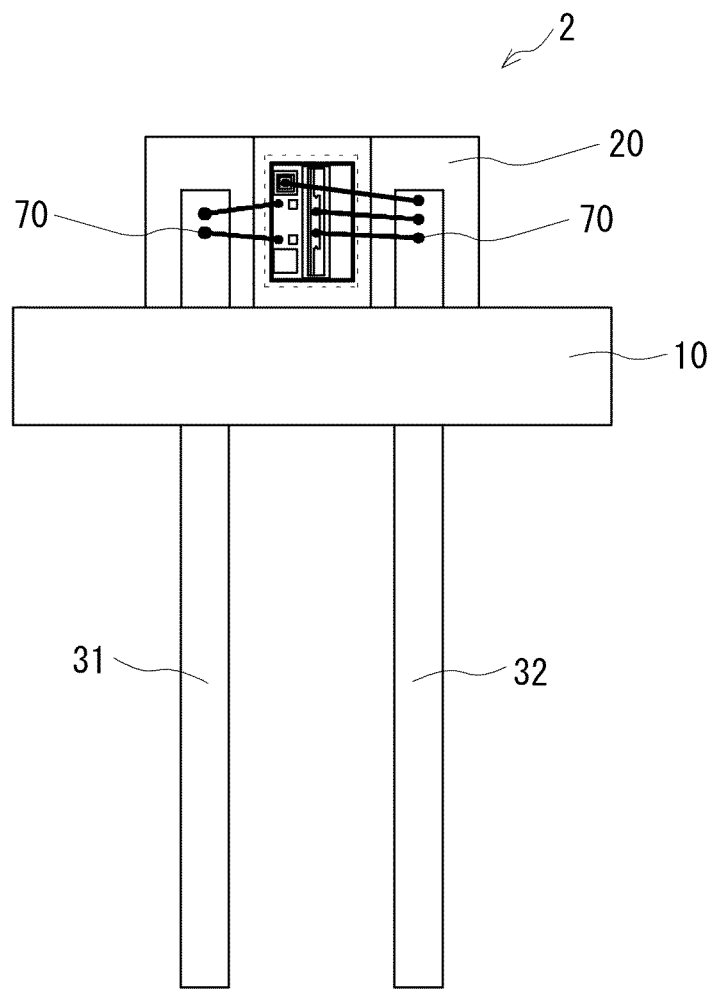
FIG. 2A is a schematic front view of a semiconductor laser device according to a second embodiment (in which a cap is not shown).
Figure 2B:
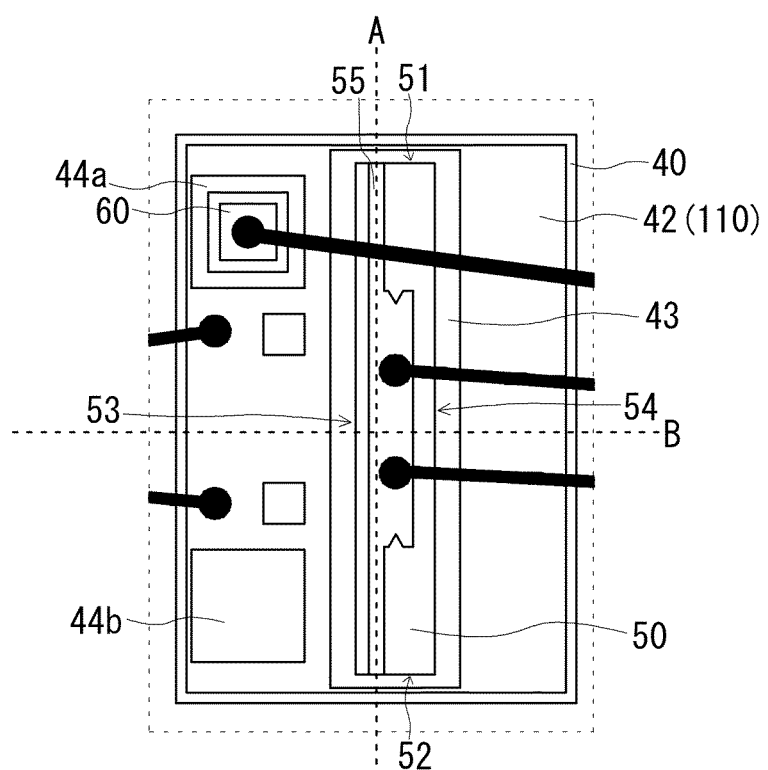
FIG. 2B is an enlarged view of a portion surrounded by a broken line in FIG. 2A.
Figure 2C:
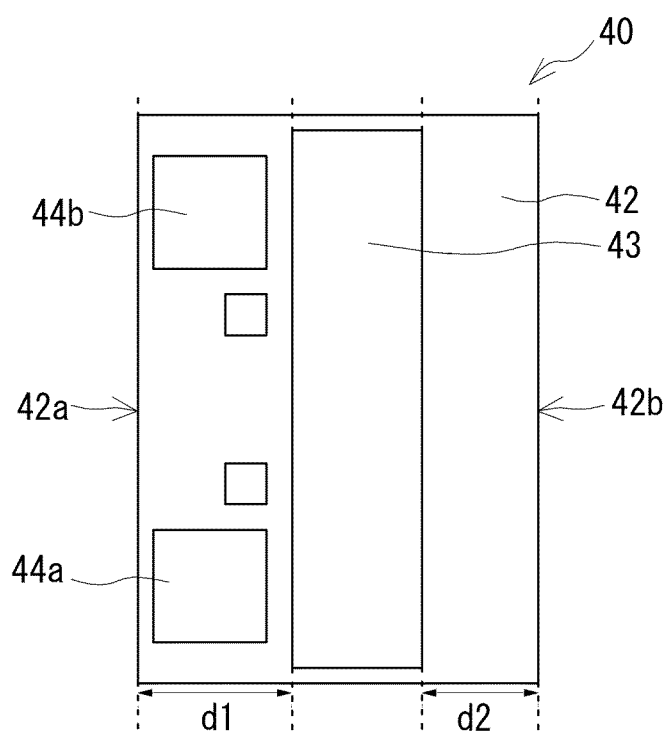
FIG. 2C is a schematic front view of a submount according to the second embodiment.

FIG. 2A is a schematic front view of a semiconductor laser device 2 according to a second embodiment (in which the cap is not shown). FIG. 2B is an enlarged view of a portion surrounded by a broken line in FIG. 2A. FIG. 2C is a schematic front view of the submount 40 according to the second embodiment. As shown in FIGS. 2A to 2C, in the second embodiment, the optical waveguide region 55 of the semiconductor laser element 50 is offset toward the opposite side relative to the first embodiment. That is, the optical waveguide region 55 of the semiconductor laser element 50 is offset toward the second lateral surface 54. Therefore, as has been described above, the submount 40 is turned upside down. In this manner, using the submount 40, the optical waveguide region 55 can be disposed on or around the line A connecting between the midpoint of the upper edge and the midpoint of the lower edge of the second main surface 42, irrespective of whether the semiconductor laser element 50 is of the type in which the optical waveguide region 55 is offset toward the first lateral surface 53 or of the type in which the optical waveguide region 55 is offset toward the second lateral surface 54.

Semiconductor Laser Device 3 According to Third Embodiment

Figure 5A:
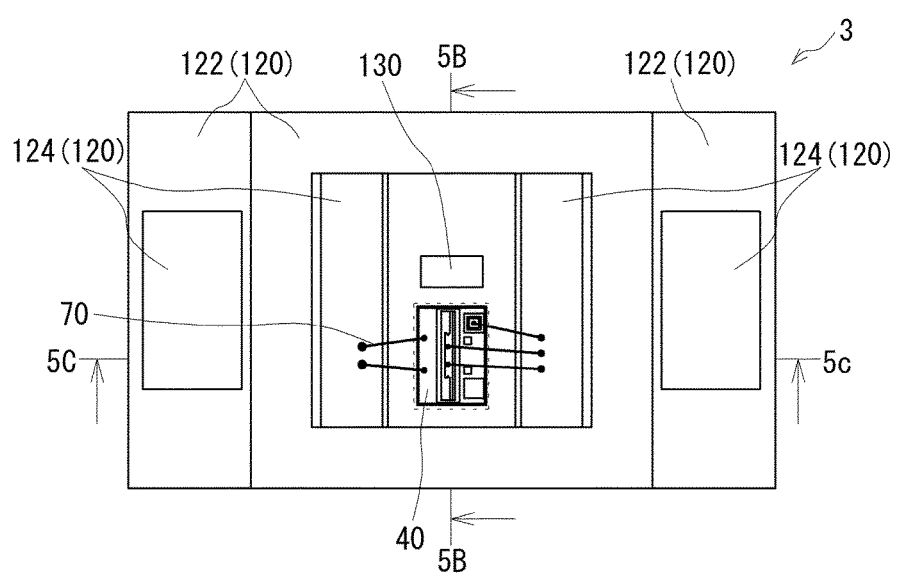
FIG. 5A is a schematic top view of a semiconductor laser device according to a third embodiment (in which a cap is not shown).
Figure 5B:
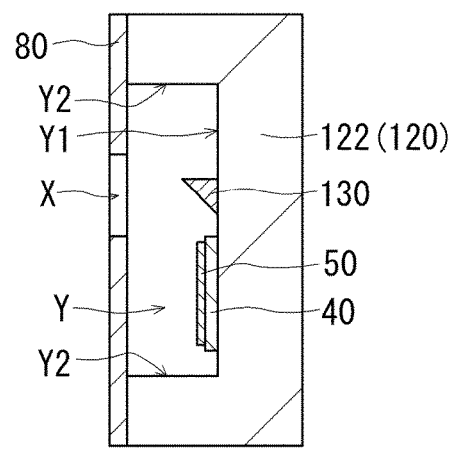
FIG. 5B is a schematic cross-sectional view taken along line 5B-5B in FIG. 5A.
Figure 5C:
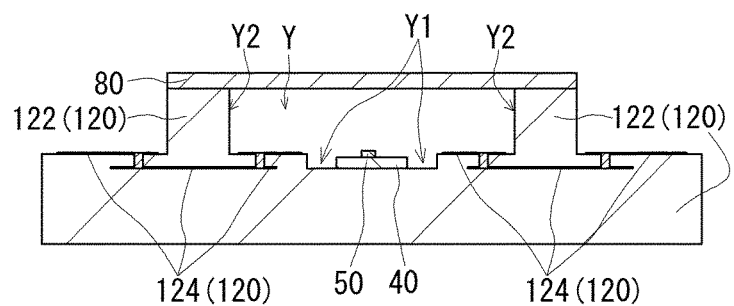
FIG. 5C is a schematic cross-sectional view taken along line 5C-5C in FIG. 5A.
Figure 5D:
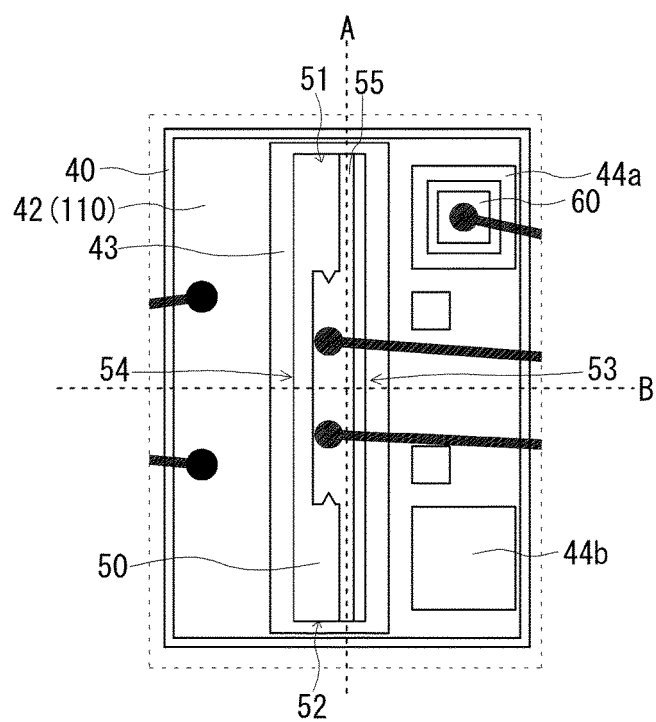
FIG. 5D is an enlarged view of a portion surrounded by a broken line in FIG. 5A.

FIG. 5A is a schematic top view of a semiconductor laser device 3 according to a third embodiment (in which the cap is not shown). FIG. 5B is a schematic cross-sectional view taken along line 5B-5B in FIG. 5A. FIG. 5C is a schematic cross-sectional view taken along line 5C-5C in FIG. 5A. FIG. 5D is an enlarged view of a portion surrounded by a broken line in FIG. 5A. As shown in FIGS. 5A to 5D, the semiconductor laser device 3 includes a housing 120, the submount 40, the semiconductor laser element 50, the protective element 60, and the wires 70. The members denoted by the reference characters identical to those in the first and second embodiments may be similarly structured as in the first and second embodiments.

The housing 120 includes an insulating part 122 and a plurality of wiring parts 124. The housing 120 includes a recess Y. The recess Y is defined by a bottom surface Y1, and inner lateral surfaces Y2 surrounding the bottom surface Y1. In the recess Y, part of the wiring parts 124 is exposed outside the insulating part 122.

The submount 40 includes the first main surface 41 and the second main surface 42. The first main surface 41 is fixed to the bottom surface Y1. The second main surface 42 includes the first fixing part 43 and the two second fixing parts 44a, 44b. The two second fixing parts 44a, 44b are disposed laterally relative to the first fixing part 43 and respectively in the front half region and the rear half region of the second main surface 42. The side from which the semiconductor laser element 50 emits laser light (the light output surface 51 side) is the front side, and the side opposite thereto (the light reflecting surface 52 side) is the rear side. The region occupying the front half of the second main surface 42 is the front half region, and the region occupying the rear half thereof is the rear half region.

The semiconductor laser element 50 includes the light output surface 51, the light reflecting surface 52, two lateral surfaces 53, 54 intersecting the light output surface 51, and the optical waveguide region 55. The optical waveguide region 55 is formed to be offset toward one of the two lateral surfaces 53, 54. The semiconductor laser element 50 is fixed to the first fixing part 43 so that the light output surface 51 is directed frontward and the optical waveguide region 55 is disposed on or around a line that passes through the midpoint of the front edge and the midpoint of the rear edge of the second main surface 42 as seen in a top view. The term "as seen in a top view" refers to viewing the second main surface 42 of the submount 40 in the direction substantially perpendicular to the second main surface 42.

The protective element 60 is fixed to front one of the two second fixing parts 44a, 44b. The wire 70 connects between the protective element 60 and one of a plurality of wiring parts 124.

The semiconductor laser device 3 includes a light reflecting member 130 that is disposed at the bottom surface Y1, for example. The laser light output from the semiconductor laser element 50 has its direction changed by the light reflecting member 130, and extracted from the opening X at the cap 80.

The semiconductor laser device 3 having such a structure can exhibit the effect similar to that exhibited by the semiconductor laser devices 1, 2 according to the first and second embodiments.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor laser device comprising:
    a housing comprising:
        a recess defined by a lower upward-facing surface, a first upper upward-facing surface, a second upper upward-facing surface, and inner lateral surfaces, wherein the first and second upper upward-facing surfaces are formed inward of the inner lateral surfaces and above the lower upward-facing surface, and
        a plurality of wiring parts, the plurality of wiring parts including a first wiring part disposed directly on the first upper upward-facing surface;
    a cap disposed on the housing outside the recess;
    a submount comprising:
        a first main surface fixed to the lower upward-facing surface of the recess, and
        a second main surface including a first fixing part and a second fixing part,
        wherein, in a plan view of the semiconductor laser device, the submount is disposed between the first upper upward-facing surface and the second upper upward-facing surface;
    a semiconductor laser element including a light output surface, a first lateral surface intersecting the light output surface, a second lateral surface intersecting the light output surface and an optical waveguide region, the semiconductor laser element being fixed to the first fixing part of the submount;
    a protective element fixed to the second fixing part of the submount; and
    a first wire connecting the protective element and the first wiring part;

wherein, in the plan view of the semiconductor laser device, a distance between the first lateral surface of the semiconductor laser element and the first upper upward-facing surface is smaller than a distance between the optical waveguide region and the first upper upward-facing surface; and wherein, in the plan view of the semiconductor laser device, a distance between the second lateral surface of the semiconductor laser element and the second upper upward-facing surface is smaller than a distance between the optical waveguide region and the second upper upward-facing surface.

2. The semiconductor laser device according to claim 1, wherein, in the plan view of the semiconductor laser device, the optical waveguide region is disposed closer to the first lateral surface of the semiconductor laser element than to the second lateral surface of the semiconductor laser element.

3. The semiconductor laser device according to claim 2, wherein, in the plan view of the semiconductor laser device, a distance between the second fixing part and the first upper upward-facing surface is smaller than a distance between the first fixing part and the first upper upward-facing surface.

4. The semiconductor laser device according to claim 2, further comprising:

a second wire connecting the semiconductor laser element and the first wiring part across the optical waveguide region.

5. The semiconductor laser device according to claim 3, wherein:

the plurality of wiring parts includes a second wiring part disposed on the second upper upward-facing surface; and the semiconductor laser device further comprises a third wire connecting the submount and the second wiring part.

6. The semiconductor laser device according to claim 1, further comprising:

a light reflecting member disposed on the lower upward-facing surface;

wherein the plurality of wiring parts are located on both lateral sides of the light reflecting member, and are not located behind the light reflecting member in a direction from the semiconductor laser device toward the light reflecting member.

7. The semiconductor laser device according to claim 1, wherein the first and second upper upward-facing surfaces are above than the second main surface.

* * * * *